United States Patent
Jurzitza

(10) Patent No.: US 9,083,285 B2
(45) Date of Patent: Jul. 14, 2015

(54) OPTICAL DETECTOR SYSTEM

(75) Inventor: Dieter Jurzitza, Karlsruhe (DE)

(73) Assignee: Harman Becker Automotive Systems GmbH, Karlsbad (DE)

(*) Notice: Subject to any disclaimer, the term of this patent is extended or adjusted under 35 U.S.C. 154(b) by 1429 days.

(21) Appl. No.: 11/049,777

(22) Filed: Feb. 1, 2005

(65) Prior Publication Data
US 2005/0180763 A1      Aug. 18, 2005

(30) Foreign Application Priority Data
Feb. 2, 2004 (EP) .................................. 04002218

(51) Int. Cl.
*H04B 10/00* (2013.01)
*H03F 3/08* (2006.01)

(52) U.S. Cl.
CPC ....................................... *H03F 3/08* (2013.01)

(58) Field of Classification Search
USPC ................................................. 398/202–214
See application file for complete search history.

(56) References Cited

U.S. PATENT DOCUMENTS

| | | | | |
|---|---|---|---|---|
| 5,179,461 A * | 1/1993 | Blauvelt et al. | ............... | 398/202 |
| 5,239,402 A * | 8/1993 | Little et al. | .................... | 398/202 |
| 5,347,388 A * | 9/1994 | Little et al. | .................... | 398/202 |
| 5,347,389 A * | 9/1994 | Skrobko | ....................... | 398/202 |
| 5,355,242 A * | 10/1994 | Eastmond et al. | ............ | 398/202 |
| 5,477,370 A * | 12/1995 | Little et al. | .................... | 398/202 |
| 5,517,035 A * | 5/1996 | Krijntjes | ...................... | 250/551 |
| RE35,762 E * | 4/1998 | Zimmerman | ................. | 250/574 |
| 5,933,264 A * | 8/1999 | Van Der Heijden | ......... | 398/202 |
| 6,118,567 A * | 9/2000 | Alameh et al. | ............... | 398/191 |
| 6,410,902 B1 * | 6/2002 | Matsumoto | ............ | 250/214 LA |
| 6,462,327 B1 | 10/2002 | Ezell et al. | | |
| 6,674,967 B2 * | 1/2004 | Skrobko et al. | .................. | 398/72 |
| 7,242,871 B2 * | 7/2007 | Huang et al. | .................. | 398/210 |

FOREIGN PATENT DOCUMENTS

| | | |
|---|---|---|
| EP | 0 485 828 A1 | 5/1992 |
| EP | 0 629 042 A1 | 12/1994 |
| EP | 0 909 044 A1 | 4/1999 |

* cited by examiner

*Primary Examiner* — Agustin Bello
(74) *Attorney, Agent, or Firm* — O'Shea Getz P.C.

(57) ABSTRACT

An optical detector circuit comprises a photodetector including an optical input for generating a detection signal; a pre-amplifier including a pre-amplifier input and a pre-amplifier output for generating a pre-amplified signal, the pre-amplifier input coupled to the photodetector; and an amplifier including a amplifier input and an amplifier output for generating an output signal, the amplifier input coupled to the pre-amplifier output.

33 Claims, 3 Drawing Sheets

OPTICAL DETECTOR SYSTEM

RELATED APPLICATIONS

This application claims priority to European Patent Application Serial No. 04002218.8 filed on Feb. 2, 2004, which is incorporated into this application by reference in its entirety.

BACKGROUND OF THE INVENTION

1. Field of the Invention

This invention relates generally to amplifier circuits. More specifically, this invention relates to an amplifier circuit for generating an electrical output responsive to optical signals received over an optical data network.

2. Related Art

Optical data networks provide extremely high throughput over long distances with high resistance to noise. Optical fiber typically routes the optical pulses to their destinations. However, in most instances, those destinations are conventional electrical processing circuits that cannot directly accept or manipulate optical data. As a result, an interface is inserted between the optical network and the electrical processing circuits to convert the optical data into electrical pulses.

Some interfaces employ a photodiode to detect the optical signal and output a low-level electrical detection signal. A subsequent amplification stage coupled directly to the photodiode boosts the low level electrical signal to create a useful output signal representative of the optical signal originally received. In the past, however, this approach has suffered from several drawbacks.

In particular, the photodiode is often only responsive enough to create a very small response signal. For that reason, the subsequent amplification stage must employ tremendous levels of amplification to generate an output signal at a level appropriate for subsequent processing electronics. All circuits, however, are characterized by a certain amount of noise. For this reason, the small detection signal often drowns in the input noise of the amplification stage. While the output signal includes a contribution from the response signal, the output signal is overwhelmingly noise. The response signal is thus lost, along with the data it represented. Therefore, there is a need for overcoming the problems noted above, and other previously experienced.

SUMMARY

This invention provides an optical detector circuit capable of detecting optical data pulses on an optical carrier. The optical detector circuit includes a photodetector, with an optical input, for generating a detection signal, a pre-amplifier connected to the photodetector for generating a pre-amplified signal, and/or an amplifier coupled to the pre-amplifier for generating an output signal from the pre-amplified signal.

This invention also provides methodologies for detecting an optical pulse. These methodologies include sensing the optical pulse with a photodetector and generating a detection signal, pre-amplifying the detection signal to generate a pre-amplified signal, and/or amplifying the detection signal to generate an output signal.

This optical detection system may be incorporated and used in a variety of applications out of traditional long haul data transmission. These applications may include use in local area networks (LANs), controller area networks (CANs), home area networks, shipboard, aircraft or vehicle data networks as well as in any telecommunication network. In shipboard, aircraft or vehicle data networks, the optical detection system may include an optical carrier for communicating optical pulses to pre-selected locations and electrical processing circuits coupled to the optical carrier through optical detector circuits. The optical detector circuits may include a photodetector coupled to the optical carrier for generating a detection signal, a pre-amplifier coupled to the photodetector for generating a pre-amplified signal, and/or an amplifier coupled to the processing circuit for generating an output signal from the pre-amplified signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Figure 1:
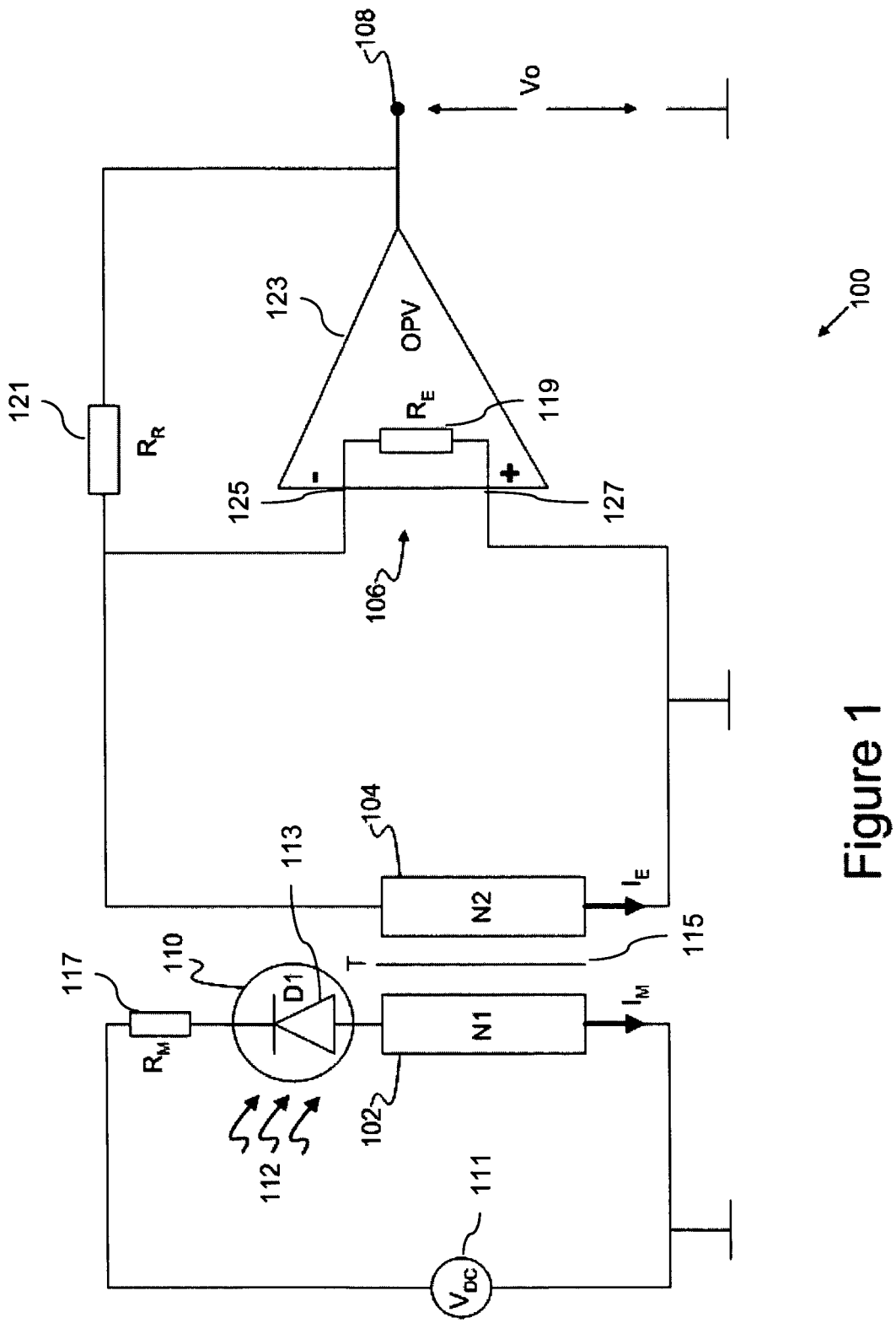
FIG. 1 is a block diagram illustrating an optical detector circuit.

FIG. 1 shows an optical detector circuit 100 that includes a photodetector D1 113, a pre-amplifier T 115, and an amplifier OPV 123 with feedback resistor $R_R$ 121. The pre-amplifier T 115 includes a pre-amplifier input 102 and a pre-amplifier output 104. Similarly, the amplifier OPV 123 includes an amplifier input 106 and an amplifier output 108. The pre-amplifier T 115 may be a high frequency transformer where the pre-amplifier input 102 is an N1-turn input winding and where the pre-amplifier output 104 is an N2-turn output winding. The optical detector circuit 100 is not limited to vehicle networks such as ships, aircraft, trucks and automobiles. Instead, the optical circuit 100 may be employed in any optical data network that translates optical data signals into electrical signals.

The transformer may also be an electromagnetic current amplifier capable of boosting a detection signal (e.g., the detection current $I_M$) generated by the photodetector D1 113 to generate a pre-amplified signal (e.g., the pre-amplified current $I_E$). The pre-amplifier T 115 amplifies the detection signal by the ratio N1/N2 (transfer coefficient), referred to below as the transfer coefficient. In other words, $I_E=I_M*(N1/N2)$.

The amplifier OPV 123 may also be an operational amplifier where the amplifier input 106 is capable of handling inverting (−) inputs 125 and non-inverting (+) inputs 127. The amplifier output 108 carries the output signal $V_o$ generated by amplifying the pre-amplified signal. The amplifier input 106 is connected to the pre-amplifier output 104, while the pre-amplifier input 102 is connected to the photodetector D1 113.

The photodetector D1 113 may include an optical input 110 having a mechanical coupling to an optical carrier such as optical fiber. The photodetector D1 113 may be a photodiode, such as a p-type, i-type, n-type (PIN) diode, or an avalanche photodiode, or another type of optical detector that converts incident light photons to electrical signals. The photodetector D1 113, in response to the optical signal 112 carried on the optical carrier, generates the detection current $I_M$ that is representative of the optical signal 112.

The amplifier OPV 123 may also be configured as a transimpedance amplifier. In other words, the amplifier OPV 123 converts an input current signal to an output voltage signal. To that end, the amplifier OPV 123 may be an operational amplifier with a feedback resistor $R_R$ 121. The Feedback resistor $R_R$ 121 may be connected between the amplifier output 108 and the inverting input (−) 125. In that implementation, the output signal $V_o = I_E * R_R = I_M * (N1/N2) * R_R$.

A bias voltage source $V_{DC}$ 111 may optionally be provided. The bias voltage source $V_{DC}$ 111 connects to the photodetector D1 113 and the pre-amplifier input 102. The bias voltage $V_{DC}$ is pre-selected to place the operating point of the photodetector D1 113 in a region of operation suitable for the particular optical carrier and optical signals present on the optical carrier. Thus, the bias voltage $V_{DC}$ may be selected according to a specification or standards document to which the optical data network adheres. Providing the bias voltage source $V_{DC}$ 111 may increase the bandwidth of the optical detector circuit 100 in certain situations, and also generates an offset level at the amplifier output 108 which should be considered when subsequently processing the output signal $V_o$.

Generally, in practical modes of operation, the photodetector 113 includes an internal detector resistance $R_M$ 117. Similarly the amplifier OPV 123 includes an amplifier resistance $R_E$ 119 present across the amplifier input 106. The amplifier resistance $R_E$ 119 may be approximated as $R_E = R_R/A$, where A is the open-loop gain of the amplifier OPV 123.

A portion of the detection current $I_E$ flows through amplifier resistance $R_E$ 119 and therefore the amplifier resistance $R_E$ 119 dissipates a portion of $I_E^2 * R_E$ in power. Because $I_E = I_M * (N1/N2)$, the power dissipated by the amplifier resistance $R_E$ 119 may also be expressed as a portion of $I_M^2 * (N1/N2)^2 * R_E$. Thus, the power dissipated by the amplifier resistance $R_E$ 119 is influenced according to the square of the transfer coefficient N1/N2.

The transfer amplifier resistance $R_E'$ on the photodetector side may be considered to approximate the photodetector side impedance $Z_M$ of the optical detector 100. Similarly, the amplifier resistance $R_E$ 119 may be considered to approximate the amplifier side impedance $Z_E$ of the optical detector 100. In order to transfer as much power as possible to the amplifier OPV 123, the detector impedance $Z_M$ is desirably equal to the conjugate complex value of the amplifier impedance $Z_E$ (or as an approximation, $R_M$ 117 is approximately equal to $R_E$ 119). Note that when the pre-amplifier T 115 is a transformer, the transfer coefficient has an impact on the impedances $Z_M$ and $Z_E$ according to the following relationship: $Z_M = (1/(N1/N2)^2) * Z_E$. Thus, whether $Z_E$ is greater than, less than or equal to $Z_M$ depends on the turns ratio N1/N2 of the windings in the transformer.

The amplifier resistance $R_E$ 119 and amplifier impedance $Z_E$ will vary in accordance dance with loading effects, and with the optical input signal frequency range of the optical input signal 112. Thus, the optical detector circuit 100 may be designed (e.g., by changing the transfer coefficient N1/N2) such that over a pre-selected frequency range the input amplifier impedance $Z_E$ gets significantly closer to the detector output impedance $Z_M$. Or, as an approximation, the transfer coefficient N1/N2 may be modified so that the detector resistance $R_M$ 117 is approximately equal to the amplifier impedance $Z_E$ (or, as a further approximation, $R_E$ 119). The pre-specified frequency range may encompass the specified optical input signal frequency range of the optical input signal 112, or overlap that range at least in part.

In one implementation suitable for incorporating the optical detector circuit 100 into a network, N1 may be in a range of 4 to 16 turns, preferably 8 to 12 turns, more preferably 10 turns, N2 may be in a range of 1 to 5 turns, preferably 3 turns, $V_{DC}$ may be in the range of 1V to 10V, preferably 2V to 7V, more preferably 5V, $R_R$ 121 may be in the range form 1 kΩ to 100 kΩ, preferably in the range from 5 kΩ to 50 kΩ, more preferably 10 kΩ, and the amplifier OPV 123 may be any suitable amplifier, for example a CLC 425 from National Semiconductor. The photodetector D1 113, including the mechanical coupling for the optical input, may be obtained, for example, from commercial manufacturers such as Agilent, Infineon, etc.

The pre-amplifier T 115, when implemented as a transformer, provides an inductive current amplifier that yields improvements in sensitivity and noise reduction for detecting the optical input signal 112. The pre-amplifier T 115 provides a first stage of low-noise amplification that reduces the magnitude of amplification employed by the amplifier OPV 123. Thus, even small input signals 112 are cleanly detected rather than being drowned in output signal noise because the amplifier OPV 123 needs not to employ enormous levels of amplification. Note also that the pre-amplifier T 115 provides electrical isolation between the photodetector D1 113 and the amplifier OPV 123. As a result, interference effects are isolated and do not couple between the photodetector D1 113 and the amplifier OPV 123.

Figure 2:
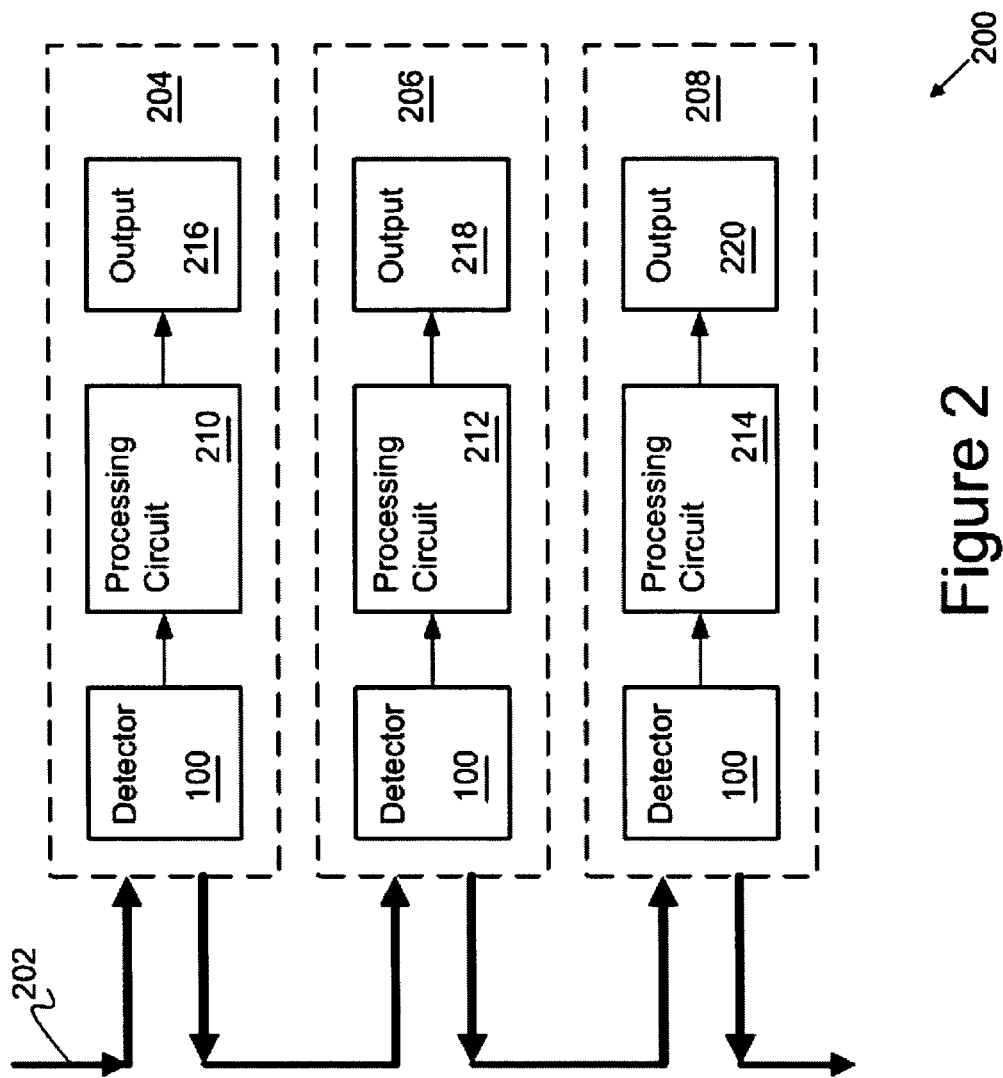
FIG. 2 is a block diagram illustrating a vehicle data network that incorporates the optical detector circuit shown in FIG. 1.

FIG. 2 shows a data network 200 that incorporates the optical detector circuit 100 shown in FIG. 1. The data network 200 may be utilized in a variety of vehicles such as ships, aircrafts, trucks, or other motorized vehicles, and may be capable of routing a wide variety of data such as audio data; navigation system data; operational control data of vehicle; video data and other types of data to selected locations in the vehicle. The data network 200 may include an optical carrier 202 and processing circuits 210, 212, 214 present at multiple pre-selected locations 204, 206, 208. The optical carrier 202 may be a transport medium for optical signals. Although the network 200 is shown passing serially through each location 204-208 as a ring network, the network 200 may employ different topologies instead, for example star, mesh, bus, tree, dual ring or linear topology or any combination of the previous mentioned network topologies, e.g. hybrid topology. Any number of locations 204-208 may be included in the data network 200.

At each location 204-208, an optical detector circuit 100 converts optical signals on the optical carrier 202 to electrical signals for the processing circuits 210, 212, 214, respectively. The processing circuits 210-214 perform their respective tasks, and provide the results, if any, on the outputs 216-220, respectively. The locations 204-208 may be any location in the automobile where it is desired to place electrical processing circuits. As examples, the locations 204-208 may include an engine compartment, a dashboard, a video display, speakers around the periphery of the automobile, an antenna on the roof, and the like. As just a few examples, the processing circuits 210-214 may include processors, filters, GPS navigation computers, engine sensors, radios, video players, break sensors, and so on, while the outputs may include CRT or LCD displays, speakers, speech systems, head-up displays, and display illuminators that provide information to the occupants of the vehicle.

Figure 3:
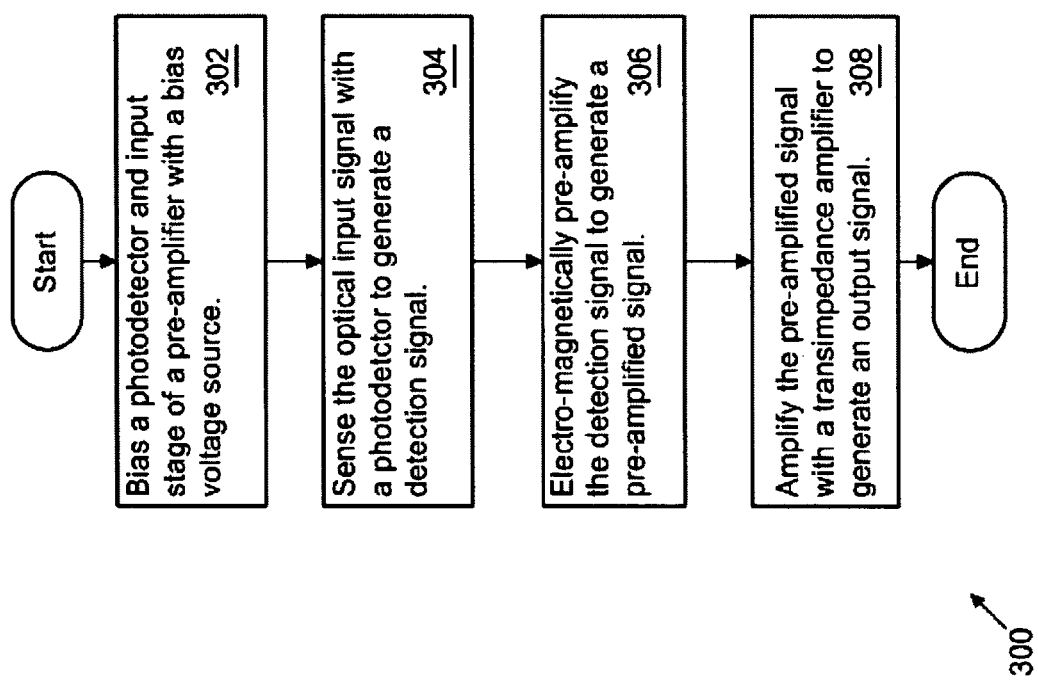
FIG. 3 a flow chart illustrating the steps for detecting optical pulses carried by an optical carrier.

FIG. 3 shows a flow diagram of steps taken to detect optical pulses carried by an optical carrier. The bias voltage source $V_{DC}$ 111 is optionally provided to bias the photodetector D1

113 and pre-amplifier input 102 (302). The photodetector 113 then senses the optical input signal 112 and responsively generates a detection signal, such as the detection current $I_M$ (304).

Subsequently, the pre-amplifier T 115 electromagnetically pre-amplifies the detection signal to generate a pre-amplified signal (306). Thus, for example, a transformer may be employed as a current amplifier to boost the detection current $I_M$ to generate the pre-amplified current $I_E$. A transimpedance amplifier then amplifies the pre-amplified signal to form an output signal (308). For example, an operational amplifier may be employed to convert the pre-amplified current $I_E$ into an output voltage $V_o$.

The optical detector circuit 100 provides 5 dB or more of additional sensitivity to optical input signals 112. In other words, the usable signal range of the photodetector D1 113 expands to encompass much lower level signals. In addition, the additional sensitivity allows a broader selection of photodetectors to be employed as the photodetector D1 113. For that reason, the optical detector circuit 100 may incorporate more cost effective photodetectors (including many types of PIN diodes) that are not necessarily specifically tailored as optical signal sensors for optical networks. Further, the optical detector circuit 100 can include a matched power preamplifier 115 adjusted to any suitable photodetector 113 for minimizing losses while increasing transmission bandwidth.

While various embodiments of the invention have been described, it will be apparent to those of ordinary skill in the art that many more embodiments and implementations are possible that are within the scope of this invention.

The invention claimed is:

1. An optical detector circuit comprising:
  a photodetector including an optical input, the photodetector configured for generating a detection signal;
  a pre-amplifier including a pre-amplifier input coupled to the photodetector and a pre-amplifier output, the pre-amplifier configured for amplifying the detection signal and generating a low-noise, pre-amplified signal;
  an amplifier including an amplifier input and an amplifier output for generating an output signal, the amplifier input coupled to the pre-amplifier output; and
  a bias voltage source coupled in parallel to the optical input and to the pre-amplifier input.

2. The optical detector circuit of claim 1, where the pre-amplifier is an electromagnetic pre-amplifier.

3. The optical detector circuit of claim 1, where the pre-amplifier is a transformer.

4. The optical detector circuit according to claim 1, where the pre-amplifier is a transformer including an N1-turn input winding and an N2-turn output winding, wherein the input winding is coupled to the photodetector, and where N1 is in a range of 4 to 16 turns and N2 is in a range of 1 to 5 turns.

5. The optical detector circuit according to claim 1, where the optical detector circuit is incorporated into an optical data network in an automobile.

6. The optical detector circuit according to claim 1, where the amplifier is a transimpedance amplifier.

7. The optical detector circuit according to claim 1, where the photodetector is a photodiode.

8. The optical detector circuit of according to claim 4, where the bias voltage source is further coupled to the N1-turn input winding.

9. The optical detector circuit according to claim 1, characterized by a detector impedance $Z_M$ and an amplifier impedance $Z_E$, and where the detector impedance $Z_M$ is approximately equal to the amplifier impedance $Z_E$ over a pre-selected frequency range.

10. The optical detector circuit according to claim 9, where the pre-selected frequency range at least partially overlaps an optical input signal frequency range for an optical signal received by the detector.

11. An optical detector circuit comprising:
  a photodetector coupled to an optical input for generating a detection signal;
  means coupled to the photodetector for electro-magnetically pre-amplifying the detection signal to generate a low-noise, pre-amplified signal;
  means for amplifying the pre-amplified signal to generate an output signal and coupled to the means for pre-amplifying; and
  a bias voltage source coupled in parallel to the optical input and to the means for electro-magnetically pre-amplifying the detection signal.

12. The optical detector circuit of claim 11, where the photodetector is a photodiode.

13. The optical detector circuit of claim 11, where the optical detector is incorporated into an optical data network in an automobile.

14. A method for detecting an optical pulse, the method comprising the steps of:
  sensing the optical pulse with a photodetector and generating a detection signal;
  biasing the photodetector and the detection signal with a bias voltage $V_{DC}$ from a bias voltage source coupled in parallel to an optical input and of the photodetector and to a pre-amplifier input of a pre-amplifier, to create a biased detection signal;
  amplifying the biased detection signal using a pre-amplifier to generate a low-noise, pre-amplified signal; and
  amplifying the pre-amplified signal to generate an output signal.

15. The method of claim 14, where the step of amplifying the biased detection signal includes electro-magnetically amplifying.

16. The method of claim 14, where the step of amplifying the biased detection signal includes amplifying the biased detection signal with a transformer coupled between the photodetector and an amplifier.

17. The method according to claim 14, where the step of amplifying the pre-amplified signal includes amplifying the pre-amplified signal with a transimpedance amplifier.

18. The method according to claim 14, where the step of sensing includes generating a detection current with the photodetector.

19. The method according to claim 18, where the step of pre-amplifying comprises pre-amplifying the detection current.

20. A vehicle data network comprising:
  an optical carrier for communicating optical pulses to preselected vehicle locations; and
  an electrical processing circuit coupled to the optical carrier through an optical detector circuit, the optical detector circuit including:
    photodetector coupled to the optical carrier for generating a detection signal;
    a pre-amplifier including a pre-amplifier input coupled to the photodetector and a pre-amplifier output for amplifying detection signal and generating a low-noise, pre-amplified signal;
    an amplifier including a amplifier input and an amplifier output for generating an output signal, the amplifier input coupled to the pre-amplifier output and the amplifier output coupled to the electrical processing circuit; and a bias voltage source coupled in parallel to the optical input and to the pre-amplifier input.

21. The vehicle data network of claim 20, where the pre-amplifier is an electromagnetic pre-amplifier.

22. The vehicle data network of claim 20, where the pre-amplifier is a transformer including an N1-turn input winding and an N2-turn output winding, the input winding coupled to the photodetector and where N1 is in a range of 4 to 16 turns and N2 is in a range of 1 to 5 turns.

23. The vehicle data network according to claim 20, where the amplifier is a transimpedance amplifier.

24. The vehicle data network according to claim 20, where the photodetector is a photodiode.

25. An optical detector circuit comprising:
a photodetector including an optical input for generating a detection current representative of an optical signal arriving at the optical input;
a current amplifier coupled to the photodetector for amplifying the detection current to generate a low-noise, amplified detection current;
a transimpedance amplifier coupled to the current amplifier for generating an output voltage representative of the amplified detection current; and
a bias voltage source coupled in parallel to the optical input and to an input of the current amplifier.

26. The optical detector circuit of claim 25, where the current amplifier is a transformer including an N1-turn input winding and an N2-turn output winding, the input winding coupled to the photodetector and where N1 is in a range of 4 to 16 turns and N2 is in a range of 1 to 5 turns.

27. The optical detector circuit of claim 25, where the photodetector is a photodiode.

28. The optical detector circuit according to claim 25, where the photodetector is a PIN diode.

29. The optical detector circuit according to claim 25, where the photodetector is an avalanche photodiode.

30. The optical detector circuit according to one or more of claim 25, where the transimpedance amplifier includes an operational amplifier and a feedback resistor.

31. The optical detector circuit according to claim 4 having a detector impedance $Z_M$ and an amplifier impedance $Z_E$, where N1 and N2 are selected such that the detector impedance $Z_M$ is approximately equal to the amplifier impedance $Z_E$.

32. The method of claim 16 further comprising:
setting a detector impedance $Z_M$ to be approximately equal to an amplifier impedance $Z_E$ by selecting a transfer coefficient (N1/N2) of the transformer such that over a preselected frequency range, $Z_E$, gets significantly closer to $Z_M$.

33. The vehicle data network of claim 22 where the optical detector circuit has a detector impedance $Z_M$ and an amplifier impedance $Z_E$, where N1 and N2 are selected such that the detector impedance $Z_M$ is approximately equal to the amplifier impedance $Z_E$.

* * * * *